United States Patent
Lee et al.

(10) Patent No.: US 7,767,983 B2
(45) Date of Patent: Aug. 3, 2010

(54) EXPOSURE DEVICE

(75) Inventors: Duk Lee, Machida (JP); Yoshio Takatsu, Machida (JP)

(73) Assignee: ORC Manufacturing Co., Ltd., Tokyo (JP)

( * ) Notice: Subject to any disclaimer, the term of this patent is extended or adjusted under 35 U.S.C. 154(b) by 332 days.

(21) Appl. No.: 12/072,301

(22) Filed: Feb. 26, 2008

(65) Prior Publication Data

US 2008/0237490 A1  Oct. 2, 2008

(30) Foreign Application Priority Data

Mar. 28, 2007 (JP) .............................. 2007-083896

(51) Int. Cl.
*G01J 1/42* (2006.01)

(52) U.S. Cl. ................ 250/492.1; 250/372; 250/492.2; 250/492.22; 250/504 R; 378/34; 355/30; 355/53; 349/27; 349/29; 349/110; 349/113; 349/114

(58) Field of Classification Search ........................ None
See application file for complete search history.

(56) References Cited

U.S. PATENT DOCUMENTS

| 5,621,498 | A  | * | 4/1997  | Inoue et al. ................... 355/67 |
| 5,684,565 | A  | * | 11/1997 | Oshida et al. .................. 355/53 |
| 5,798,805 | A  | * | 8/1998  | Ooi et al. ....................... 349/10 |
| 5,868,480 | A  | * | 2/1999  | Zeinali .......................... 353/31 |
| 6,238,852 | B1 | * | 5/2001  | Klosner ....................... 430/396 |
| 6,396,045 | B1 | * | 5/2002  | Ballingall et al. ........ 250/208.1 |
| 6,707,534 | B2 | * | 3/2004  | Bjorklund et al. ............. 355/53 |
| 7,319,506 | B2 | * | 1/2008  | Den Boef et al. ............. 355/53 |
| 7,622,720 | B2 | * | 11/2009 | Nonaka et al. .............. 250/372 |
| 2003/0147325 | A1 | * | 8/2003 | Wilkinson et al. ....... 369/59.25 |
| 2003/0147326 | A1 | * | 8/2003 | Wilkinson et al. ....... 369/59.25 |
| 2003/0180453 | A1 | * | 9/2003 | Burke et al. ................. 427/162 |
| 2006/0193432 | A1 | * | 8/2006 | Matsumoto .................. 378/34 |
| 2007/0030466 | A1 | * | 2/2007 | Shuichi ....................... 355/30 |
| 2008/0218752 | A1 | * | 9/2008 | Hagler ........................ 356/317 |
| 2008/0258069 | A1 | * | 10/2008 | Nonaka et al. ............. 250/372 |
| 2008/0267248 | A1 | * | 10/2008 | Lee et al. ..................... 372/107 |
| 2009/0039292 | A1 | * | 2/2009 | Lee et al. ................. 250/492.2 |
| 2010/0049055 | A1 | * | 2/2010 | Freudenberg et al. ....... 600/475 |

FOREIGN PATENT DOCUMENTS

| JP | 2006-113413 | 4/2006 |
| JP | 2006-337475 | 12/2006 |
| JP | 2006-343684 | 12/2006 |

\* cited by examiner

*Primary Examiner*—David A Vanore
(74) *Attorney, Agent, or Firm*—Dilworth & Barrese LLP

(57) ABSTRACT

The present invention presents an exposure device, which includes an object stage on which the object is to be set, at least one aperture member for splitting a light beam from an optical source into first and second light beams, first and second spatial light modulators for spatially modulating the first and second light beams, respectively, first and second projection optical systems for irradiating the object with the first and second light beams, at least one first optical sensor for detecting intensity of the light beam from the optical source, one or more second optical sensors for detecting intensities of the first and second light beams from the first and second projection optical systems, respectively, and a decision section for diagnosing status of a route between the aperture member and the object, based on the results of the first and second sensors.

15 Claims, 12 Drawing Sheets

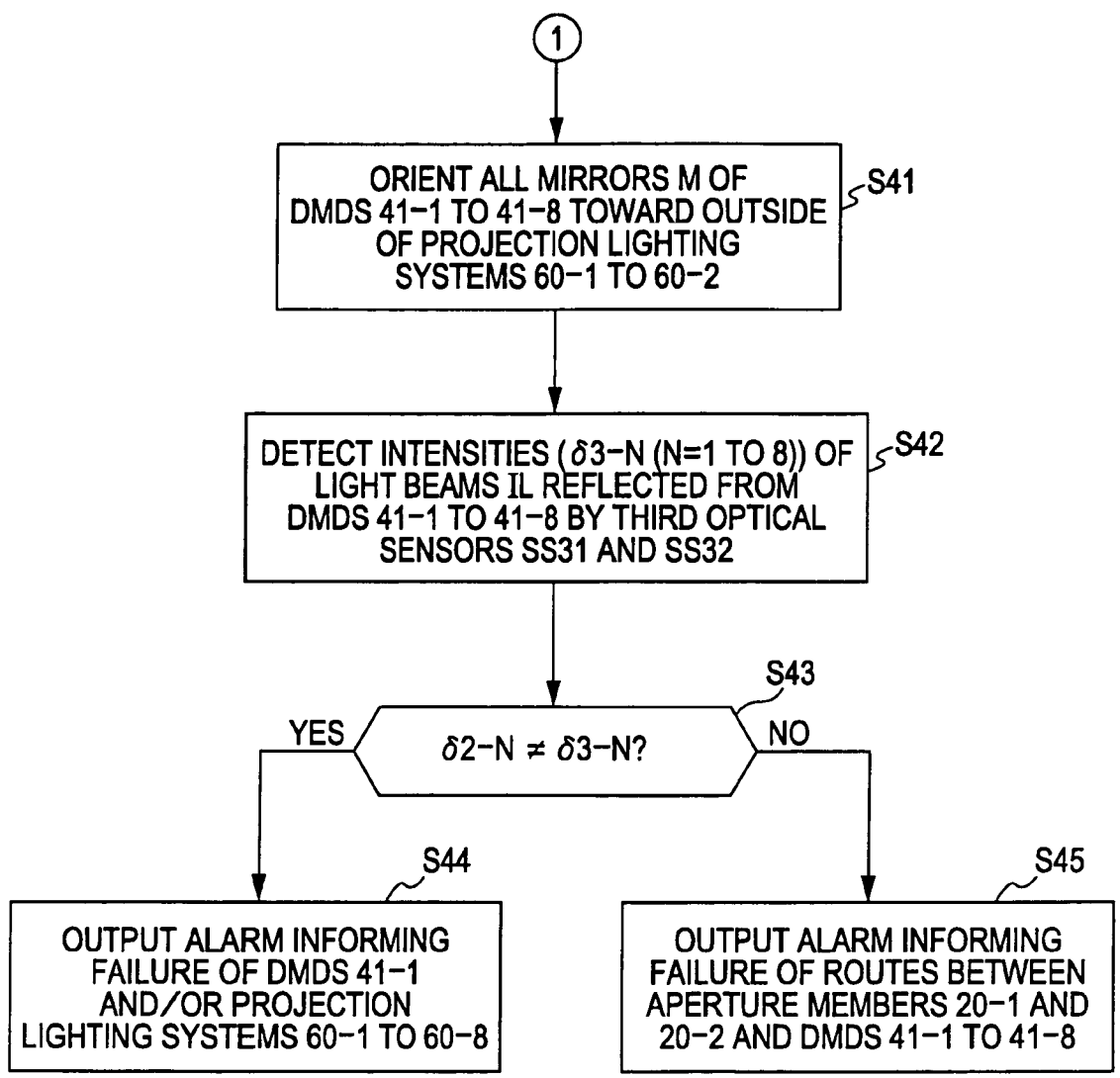

EXPOSURE DEVICE

CROSS-REFERENCE TO RELATED APPLICATIONS

This application claims the benefit of Japanese Patent Application 2007-083896 filed on Mar. 28, 2007, the disclosure of which is incorporated herein by reference.

BACKGROUND OF THE INVENTION

1. Field of the Invention

The present invention relates to an exposure device for forming patterns on a surface of a flat-sheet material, including a substrate for an electronic circuit, a glass substrate for an LCD and a glass element substrate for a PDP.

2. Description of the Related Art

In general, substrates for electronic circuits or printed circuits are applied to portable phones or various types of PCs. On a substrate of this type, multiple fine patterns, lands and via-holes tend to be formed with great precision. In order to follow this trend, an exposure device which is used in an exposure process for forming patterns needs to possess a technique for generating high-intensity and precise-collimated light beams.

A general type, that is, contact or projection type exposure device is required to handle many different types of substrates in a short period. Such an exposure device needs to contain masks to form patterns. Accordingly, multiple different masks are prepared depending on the types of substrates to be processed. However, those masks are hard to prepare, exchange or maintain, thus making it difficult to treat many different substrates efficiently.

Because of this disadvantage, interest is growing in a direct type exposure system and a device incorporating this system. This direct type exposure system transfers patterns from CAD data to a substrate by means of light beams, so that masks are unnecessary (see JP A 2006-113413, JP A 2006-343684 and JP A 2006-337475). However, a typical direct exposure device tends to have a low reaction speed in forming patterns, because its light source is a laser of short wavelength such as 405 nm. Hence, efficient direct type devices have been highly in demand.

In addition to the inefficient exposure operation as described above, a typical direct type exposure device involves a cost increase. This is because it is equipped with many spatial light modulation elements for treating large-size substrates. If high-intensity light beams are irradiated to those many spatial light modulation elements, then many light sources are required, thus leading to the increase in the material costs. The direct type exposure device of JP A 2006-343684 or JP A 2006-337475 is designed to address this disadvantage. Specifically, this device has seven low-illumination UV lamps and optical fibers. The light beams outputted from the lamps are concentrated by the optical fibers, and are incident to one or more optical systems. However, those devices fail to teach or suggest a technique for controlling the light beams in accordance with the photosensitive property of an object to be processed.

Taking the above description into account, the present invention has been conceived. An object of the present invention is to provide a direct type exposure device which works efficiently. An additional object of the present invention is to present a direct type exposure device which has a few optical sources and many digital micro-mirror devices (DMDs) functioning as spatial light modulation devices. A further object of the present invention is to produce a direct type exposure device which is designed to monitor the intensity of its light sources and the operation of its spatial light modulation devices and to control them based on the monitoring result.

SUMMARY OF THE INVENTION

According to a first aspect of the present invention, there is provided, an exposure device for forming predetermined patterns onto an object by means of UV light emitted from at least one optical source, the exposure device including:

a1) an object stage on which the object is to be set;

a2) at least one aperture member having a first open window and a second open-window for splitting a light beam from the optical source into a first light beam and a second light beam;

a3) first and second spatial light modulators for spatially modulating the first and second light beams, respectively;

a4) first and second projection optical systems for irradiating the object with the first and second light beams that have been spatially modulated by the first and second spatial light modulators, respectively;

a5) at least one first optical sensor for detecting an intensity of the light beam from the optical source, and for outputting a first output report indicating the detected intensity, the first optical sensor being located near the aperture member;

a6) one or more second optical sensors for detecting intensities of the first and second light beams that have passed through the first and second projection optical systems, respectively, and for outputting second output reports indicating the detected intensities; and a7) a decision section for diagnosing status of a route between the aperture member and the object, based on the first and second output reports.

With the exposure device of the first aspect, the intensity of the light beam from the optical source and the intensities of the split light beams can be recognized. It is thus possible for the decision section to diagnose the status of the route between the aperture member and the object.

According to a second aspect of the present invention, there is provided, the exposure device of the first aspect in which the second optical sensors are located on the object stage, and move into and escape from paths of the first and second light beams that have passed through the first and second projection optical systems, respectively.

With this structure, the paths of the first and second light beams can be accessed by the second optical sensors, when the second optical sensors detect the intensities of the first and second light beams. In addition, while the patterns are being formed on the object, the second optical sensors are away from both beams.

According to a third aspect of the present invention, there is provided, the exposure device of the first or second aspect, further including:

b1) a first iris adjuster for varying the intensity of the first light beam, the first iris adjuster being located on a path of the first light beam between the aperture member and the object; and b2) a second iris adjuster for varying the intensity of the second light beam, the second iris adjuster being located on a path of the second light beam between the aperture member and the object. Furthermore, the decision section controls operations of the first and second iris adjusters, based on the second output reports on the first and second light beams.

In general, it is almost impossible to split the light beams into the two in such a way that both beams have the same intensity. This is because multiple optical components are arranged on each light path between the optical source and the object. In the exposure device of the third aspect, however, both light beams can have the same intensity by controlling the operation of the first and second first iris adjusters.

According to a fourth aspect of the present invention, there is provided, the exposure device of the first or second aspect further including:

c1) a memory section for storing data on ideal intensity of light irradiated to the object, the data taking aged deterioration of the ideal intensity into account; and c2) a warning section for outputting an alarm, if at least one of the second output reports is different from the ideal data stored in the memory section by more than an allowable amount.

In this structure, since the memory section stores the data on ideal intensity including the aged deterioration, the actual intensities of the light beams irradiated to the object can be compared with the ideal intensity. Upon use of a high-pressure mercury lamp as the optical source, the warning section can inform that the optical source is about to be dead, based on the compared result. In fact, the warning section outputs the alarm by making sound or by flashing a lamp.

According to a fifth aspect of the present invention, there is provided, the exposure device of the first or second aspect, further including a warning section for outputting an alarm indicating the status of the route between the aperture member and the object, if at least one of the first and second output reports falls outside a predetermined range.

Consider the case where the first optical sensor outputs the first output report indicating that the first light beam falls within the predetermined range. Furthermore, the second optical sensor outputs the second output report indicating that the first light beam falls outside it. This result shows that any abnormality occurs on the route of the first light beam between the aperture member and the object. Thus, with this structure, the status of the routes of the light beams can be recognized.

According to a sixth aspect of the present invention, there is provided, the exposure device of the first or second aspect in which the decision section includes a warning section for outputting an alarm indicating status of the first and second spatial light modulators, based on the second output reports on the first and second light beams.

Typically, the first and second light beams have substantially the same intensity. If they are different, the decision section determines that the first or second spatial light modulator has failed. In response to this, the warning section outputs the alarm. An operator can exchange the failed modulator for another in response to the alarm.

According to a seventh aspect of the present invention, there is provided, the exposure device of one of the first and sixth aspects, further comprising one or more third optical sensors for detecting directly intensities of the first and second light beams from the first and second spatial light modulators, respectively and for outputting third output reports indicating the detected intensities. Moreover, the decision section diagnoses status of a route between the first spatial light modulator and the object and a route between the second spatial light modulator and the object, based on the second and third output reports.

With the second and third optical sensors, whether a failure occurs in the first and second spatial light modulators or the projection optical systems can be determined.

According to an eighth aspect of the present invention, there is provided, the exposure device of the sixth aspect in which the third optical sensors are implemented by the second optical sensors.

In the exposure device of the present invention, the optical sensors detect the light intensities at the several portions, and the decision section determines the status of the optical source and of first and second spatial light modulators based on the detected results. Furthermore, based on the determination, the exposure device produces the alarm indicating that the optical source or the spatial light modulators have been dead or failed. Consequently, it is possible to provide an exposure device which can operate, that is, form patterns stably.

Other aspects, features and advantages of the present invention will become apparent upon reading the following specification and claims when taken in conjunction with the accompanying drawings.

BRIEF DESCRIPTION OF THE DRAWINGS

For more complete understanding of the present invention and the advantages hereof, reference is now made to the following description taken in conjunction with the accompanying drawings wherein:

FIG. 12 is a flowchart of monitoring the operating status of the high pressure mercury lamps 10-1 and 10-2, the DMDs 41-1 to 41-8, and the projection optical systems 60-1 to 60-8.

DETAILED DESCRIPTION OF THE
EXEMPLARY EMBODIMENTS OF THE
INVENTION

Whole Structure of Exposure Device

Figure 1:
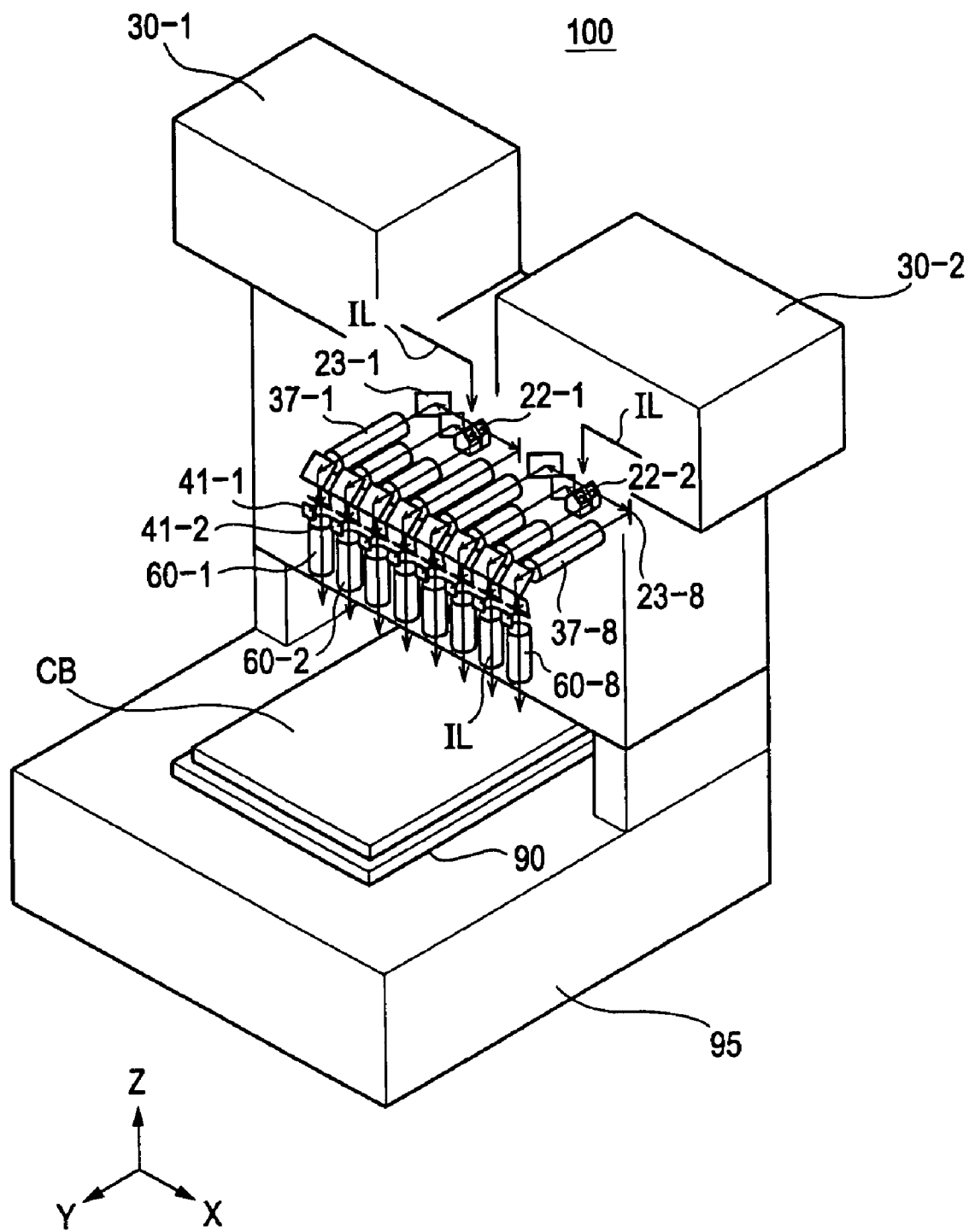
FIG. 1 is a schematically perspective view depicting an exposure device 100 according to one embodiment of the present invention.

FIG. 1 schematically shows an exposure device 100 according to an embodiment of the present invention. This exposure device 100 mainly includes first lighting systems 30-1 and 30-2, second lighting systems 37-1 to 37-8, spatial light modulation systems (thereinafter referred to as "DMDs") 41-1 to 41-8, projection optical systems 60-1 to 60-8, and an object table 90. The reason why the two first lighting systems (30-1 and 30-2) are used is to irradiate an object CB widely. These first lighting systems 30-1 and 30-2 contain a first high-pressure mercury lamp 10-1 and a second high-pressure mercury lamp 10-2 (see FIG. 2), respectively.

Figure 2:
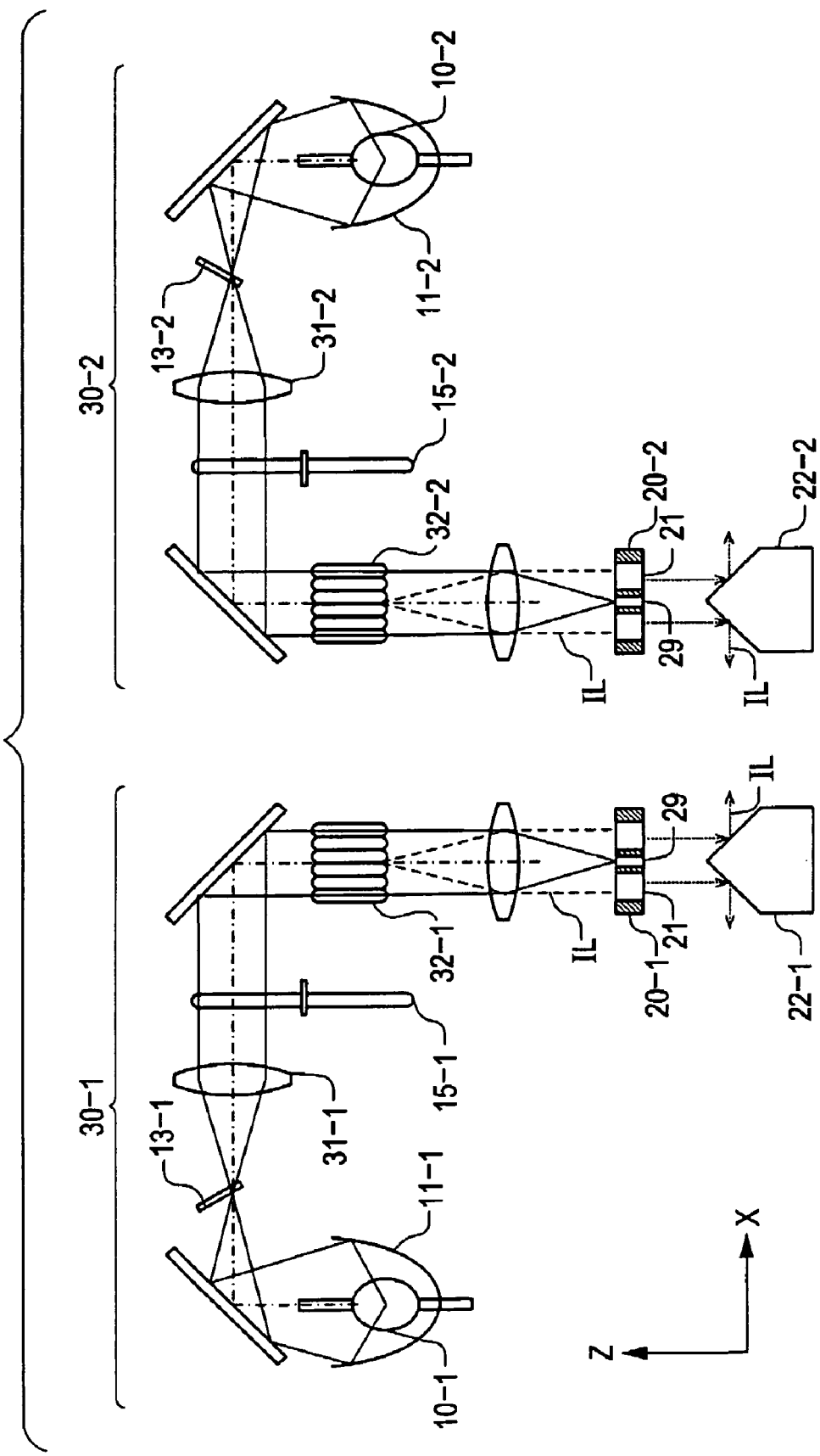
FIG. 2 is a schematic view depicting first lighting systems 30-1 and 30-2 of the exposure device 100.

FIG. 2 schematically shows the first lighting systems 30-1 and 30-2. Since both lighting systems have the identical structure, only the first lighting system 30-1 will be described below.

In this drawing, the first high-pressure mercury lamp 10-1 is located at a primary focal point of an elliptic mirror 11-1. The elliptic mirror 11-1 reflects efficiently the UV light emitted from the first high-pressure mercury lamp 10-1 toward a secondary focal point of an elliptic mirror 11-1. In this embodiment, the first high-pressure mercury lamp 10-1 is used, but the optical source is not limited to it in this invention. Alternatively, a xenon or flash lamp may be utilized. This first high-pressure mercury lamp 10-1 is designed to constantly emit a light beam IL while being supplied with electric power through a power supply controller 19 (see FIG. 9). In this way, the intensity of the light beam IL is made stable. A shutter 13-1 is placed at the secondary focal point of the elliptic mirror 11-1 and blocks off the light beam IL when the device 100 does not need to irradiate the object CB. The light beam IL from the first high-pressure mercury lamp 10-1 concentrates at the secondary focal point. Accordingly, the shutter 13-1 is positioned at the secondary focal point, so that it does not have to move greatly to block off the light beam IL.

The first lighting system 30-1 includes a collimator lens 31-1 and a fly-eye lens 32-1, and they shape the light beam IL into a beam of a uniform density. The light beam IL diverges from a point image at the secondary focal point, and is then incident to the collimator lens 31-1. This incident light beam is converted into a collimated beam, and is then inputted to a wavelength selection filter 15-1.

The wavelength selection filter 15-1 is composed of a combination of several filter elements. Examples of those filter elements include an ND filter for adjusting the intensity of light, a g-h-i filter for cutting off light of 350 nm or shorter and 450 nm or longer, an i filter for cutting off light of 350 nm or shorter and 380 nm or longer, an h filter for cutting off light of 390 nm or shorter and 420 nm or longer, and a g filter for cutting off light of 420 nm or shorter and 450 nm or longer. The combination of the filter elements is determined depending on a photoresist of the object CB. The light beam IL that has passed through the wavelength selection filter 15-1 has desired wavelength, and this beam is incident to the fly-eye lens 32-1 in order to make its density uniform.

Next, the light beam IL enters an aperture member 20-1 provided with four opening windows 21 and a detection window 29 for sensing light intensity. The light beam IL is inputted to the aperture member 20-1 in parallel with the Z axis, that is, perpendicularly to the incident surface of the aperture member 20-1. The light beam IL that has passed through the aperture member 20-1 is split into four beams IL. Finally, the beams IL1 to IL4 are reflected by a reflective optical element 22-1 composed of total reflection mirrors or a prism, and the reflected beams then travel laterally.

Referring to FIG. 1 again, the eight light beams IL (formed by the aperture members 20-1 and 20-2 and the reflective optical elements 22-1 and 22-2) are reflected by a corresponding one of the total reflection mirrors 23-1 to 23-8, and they then travel in parallel with the Y axis. Subsequently, the eight light beams IL are incident to a corresponding one of the second lighting systems 37-1 and 37-8.

The light beams IL are subjected to beam shaping in the second lighting systems 37-1 to 37-8, so that they each have a predetermined shape and preset intensity. Following this, the light beams IL are thrown to eight arrayed DMDs 41-1 to 41-8. The DMDs 41-1 to 41-8 spatially modulate the light beams IL based on an input image data. The light beams IL modulated by the DMDs 41-1 to 41-8 pass through the projection optical systems 60-1 and 60-8, respectively, so that each beam has a predetermined magnification. Finally, the light beams IL are irradiated to the object CB.

The projection optical systems 60-1 to 60-8 precisely adjust the magnifications of the light beams IL. As a result, the identical eight irradiated areas are created on the object. Moreover, the magnifications may be varied depending on the size of the object CB. The exposure device 100 has the eight projection optical systems 60-1 to 60-8 which are arrayed on the X axis.

Note that those DMDs 41-1 to 41-8 and the projection optical systems 60-1 to 60-8 are easy to fabricate and maintain.

The exposure device 100 includes a base 95 under the projection optical systems 60-1 to 60-8 with respect to the Z axis, and it supports the first lighting systems 30-1 and 30-2, the second lighting systems 37-1 to 37-8 and the projection optical systems 60-1 and 60-8. The base 95 has a pair of guide rails, and an object table 90 is mounted on the guide rails. This object table 90 is driven by a mechanism (not shown) composed of, for example, a ball screw and a stepping motor. With this mechanism, the object table 90 is moved on the guide rails lengthwise or in parallel with the Y axis relative to the projection optical systems 60-1 to 60-8. On the object table 90, a photoresist-coated substrate is set as the object CB. This object CB is fixed onto the object table 90 by means of negative pressure. In the case where the projection optical system 60-1 to 60-8 cannot irradiate the whole lateral surface area of the object CB, then the object table 90 moves in parallel with the X axis.

<Second Lighting Systems Including Aperture Members and DMDs>

Each of the aperture members 20-1 and 20-2 is made of a material having a low thermal storage property and a low thermal expansion coefficient, such as metal or ceramics. This reason is that since partially exposed to the light beams IL, the aperture members 20-1 and 20-2 tend to be heated. Furthermore, the aperture members 20-1 and 20-2 may be provided with a heatsink in order to decrease the level of the deformation due to the thermal expansion.

The opening windows 21 in each of the aperture members 20-1 and 20-2 are as many as the DMDs 41-1 to 41-8. Each reflective surface of the DMD may be 14 mm by 12 mm in size. The light beam IL irradiated to the DMDs needs to have a rectangular shape in accordance with that of the reflective surface. Furthermore, the light beams IL are required to be as many as the reflective surfaces of the DMDs.

Figure 3:
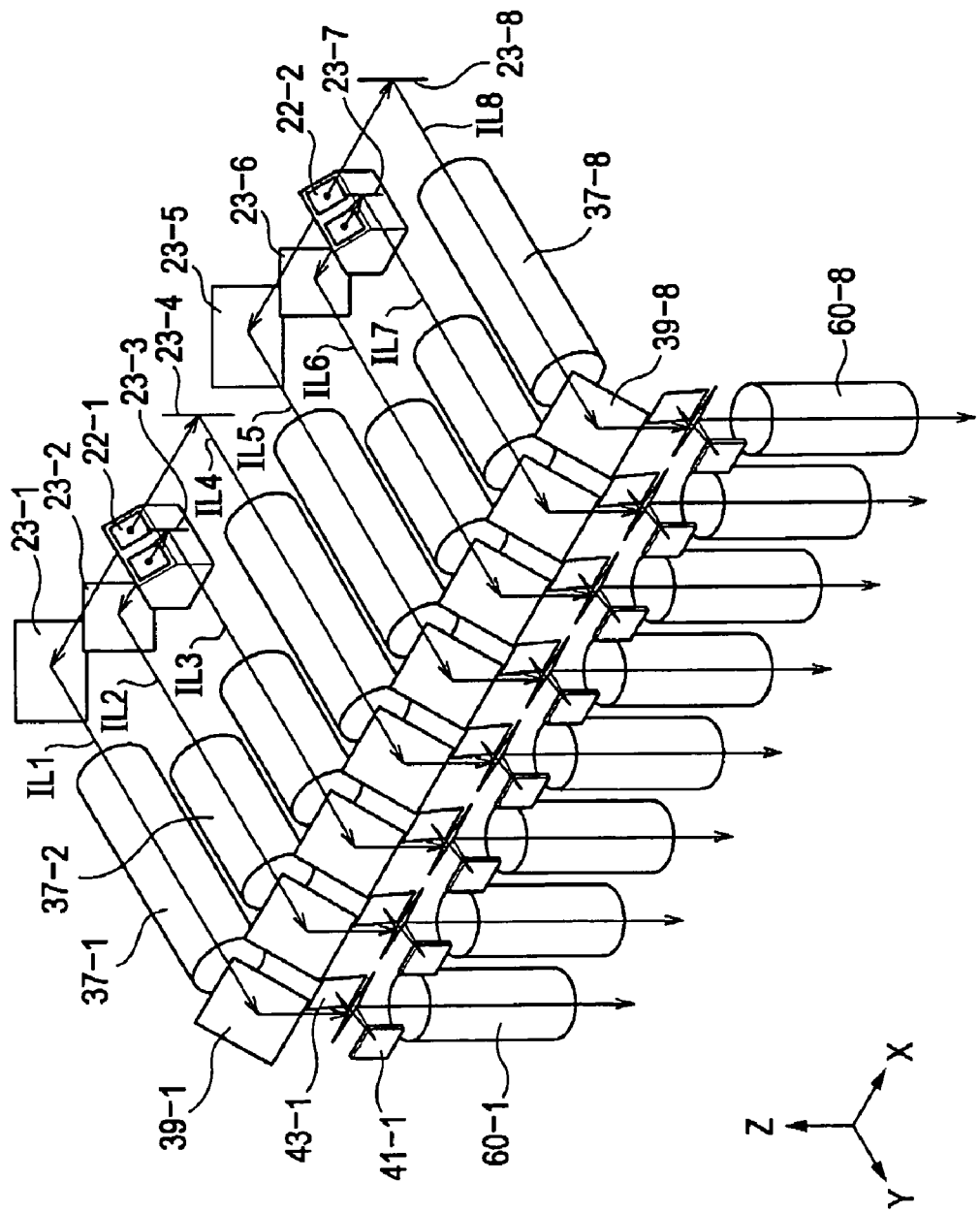
FIG. 3 is a schematic view depicting second lighting systems 37-1 to 37-8, DMDs 41-1 to 41-8 and projection optical systems 60-1 to 60-8 of the exposure device 100.
Figure 4:
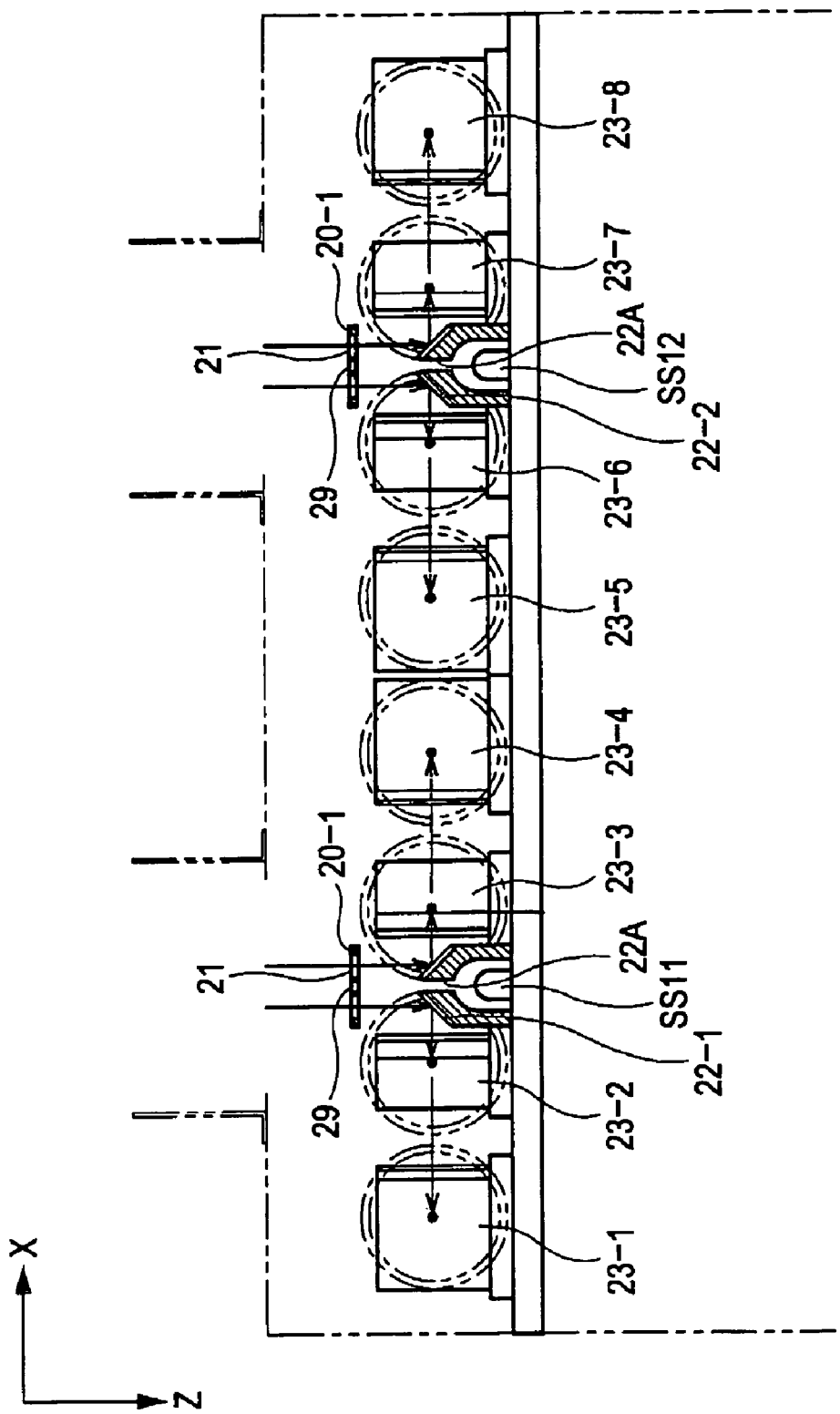
FIG. 4 is a schematic view depicting reflective optical elements 22-1 and 22-2 and total reflection mirrors 23-1 to 23-8 of the exposure device 10 as seen on a Y axis.

FIG. 3 shows the second lighting systems 37-1 to 37-8, the DMDs 41-1 to 41-8 and the projection optical systems 60-1 to 60-8. FIG. 4 shows the reflective optical elements 22-1 and 22-2 and the total reflection mirrors 23-1 to 23-8 as seen on the Y axis.

After passing through the aperture members 20-1 and 20-2, the eight light beams IL travel in parallel with the Z axis. Then, the light beams IL are reflected by a corresponding one of the reflective optical elements 22-1 and 22-2 that are constituted by flat mirrors or prisms. The reflected light beams IL travel in parallel with the X axis. Specifically, the four light beams IL that have been formed by the aperture member 20-1 are reflected by the reflective optical element 22-1. Subsequently, those four beams travel along paths IL1, IL2, IL3 and IL4 in parallel with the X axis, respectively. Likewise, the other four light beams IL, which are formed by the aperture member 20-2, are reflected by the reflective optical element 22-2 and, then travel along light paths IL5, IL6, IL7 and IL8 in parallel with the X axis, respectively. The eight light beams traveling along the paths IL1 to IL8 are reflected by the total reflection mirror 23-1 to 23-8, and are directed toward the DMDs 41-1 to 41-8 in parallel with the Y axis, respectively. As shown in FIG. 4, each of the reflective optical elements 22-1 and 22-2 has a light-transmitting zone 22A on its center. In this light-transmitting zone 22A, no through-holes or blocks are formed but merely a space is defined.

The light beams IL reflected from the total reflection mirrors 23-1 to 23-8 travel to the DMDs 41-1 to 41-8 through the second lighting systems 37-1 and 37-8, respectively. Each of the second lighting systems 37-1 and 37-8 is constituted by an iris adjuster 35 and other optical components such as lenses. As shown in FIG. 3, the light paths IL1, IL4, IL5 and IL8 (that extend between the total reflection mirror and the DMDs) have the same length. Also, the length of the light paths IL2, IL3, IL6 and IL7 is equal. However, the length of the light paths IL1, IL4, IL5 or IL8 is different from that of the light paths IL2, IL3, IL6 or IL7. After reflected by the DMDs 41-1 to 41-8, the light beams IL pass through the projection optical systems 60-1 to 60-8, respectively. Finally, they are irradiated to the object CB. Note that the light beams IL must have the same beam shape when irradiated to the object CB. However, unless all the distances between the DMDs 41-1 to 41-8 and the object CB are the same, then the resolution, dimension and other properties of patterns formed on the object CD may differ depending on the light beams IL. In consideration of this fact, the light beams IL that travel along the paths IL1 to IL8 and that have been reflected from the total reflection mirrors 23-1 to 23-8, respectively are corrected to have the same focal length. After the correction, the beams are incident to the DMDs 41-1 to 41-8. Needless to say, if the lengths of the light paths IL1 to IL8 are different from one another, then all the light beams IL must be corrected individually.

<Optical Sensor>

The exposure device 100 has multiple optical sensors for three different uses: first optical sensors SS11 and SS12 are used for detecting the light intensities of the high pressure mercury lamps 10-1 and 10-2 respectively, second optical sensors SS21 and SS22 are used for detecting the light intensities on the object CB, and the third optical sensor SS31 and SS32 are used for monitoring the status of the DMDs.

As shown in FIG. 4, the exposure device 100 has the first optical sensors SS11 and SS12 that detect light intensities of the first and second high-pressure mercury lamps 10-1 and 10-2, respectively. Those two sensors SS11 and SS12 are placed underneath the detection windows 29 of the aperture members 20-1 and 20-2, respectively. Both first sensors are arranged as close as possible to the DMDs 41-1 to 41-8, so that they are less likely to be affected by the attenuation of the optical components of the first lighting systems 30-1 to 30-2.

The reflective optical elements 22-1 and 22-2 are located under the aperture members 20-1 and 20-2 with respect to the Z axis, respectively. When reaching a corresponding one of the reflective optical elements 22-1 and 22-2 in parallel with the Z axis, the light beams IL are totally reflected by them to thereby travel in parallel with the X axis. Thus, all the reflection surfaces of the reflective optical elements 22-1 and 22-2 are angled 45 degrees with respect to a plane parallel to the X and Y axes. Preferably, the size of those reflection surfaces is determined in accordance with the opening window 21. In addition, the adjacent reflection surfaces on the reflective optical element may be replaced by a single reflection surface. Each of the reflective optical elements 22-1 and 22-2 has the light-transmitting zone 22A under the detection window 29. The first optical sensors SS11 and SS12 are located in spaces under the light-transmitting zones 22A, respectively.

The second optical sensors SS21 and SS22 (see FIG. 9) are set on the object table 90. The distance between the second optical sensors SS21 and SS22 is the same as that between the projection optical systems 60-1 and 60-2. Accordingly, the second optical sensors SS21 and SS22 can operate at the same time.

In response to the movement of the object table 90, the second optical sensors SS21 and SS22 are displaced on the X and Y axes within an area on which the object CB to be placed. When the light beams IL are irradiated to predetermined locations on the object table 90, the second optical sensors SS21 and SS22 are moved to those locations, and detect the light intensities there. After the detection, they are escaped away from the irradiated location.

The two second optical sensors (SS21 and SS22) are used in this embodiment, but one of them may be omitted. In this case, although the single second optical sensor needs to move to all predetermined locations irradiated by the projection optical systems 60-1 to 60-8, the material costs can be reduced. Alternatively, eight sensors may be provided. In this case, the light intensities of the eight light beams IL can be detected simultaneously, but understandably the sensitivities of all the sensors must be calibrated beforehand.

In this embodiment, the third optical sensors SS31 and SS32 (see FIG. 9) can be implemented by the second optical sensors SS21 and SS22. In this case, micro mirrors M of the DMDs 41-1 to 41-8 are angled not to direct the light beams IL toward the projection optical systems 60-1 to 60-8 but to direct them toward the third optical sensors SS31 and SS32. Alternatively, the independent third optical sensors SS31 and SS32 may be provided and arranged near the DMDs 41-1 and 41-8. If the exclusive third optical sensors are set on a fixture, such as a wall, located near the DMDs 41-1 to 41-8, then eight third optical sensors must be arranged corresponding to the DMDs 41-1 to 41-8, respectively. By monitoring the sensing results of the second and third optical sensors, the abnormality of the micro mirror M or the light beams incident to the DMDs can be detected.

<Iris Adjuster>

Figure 5:
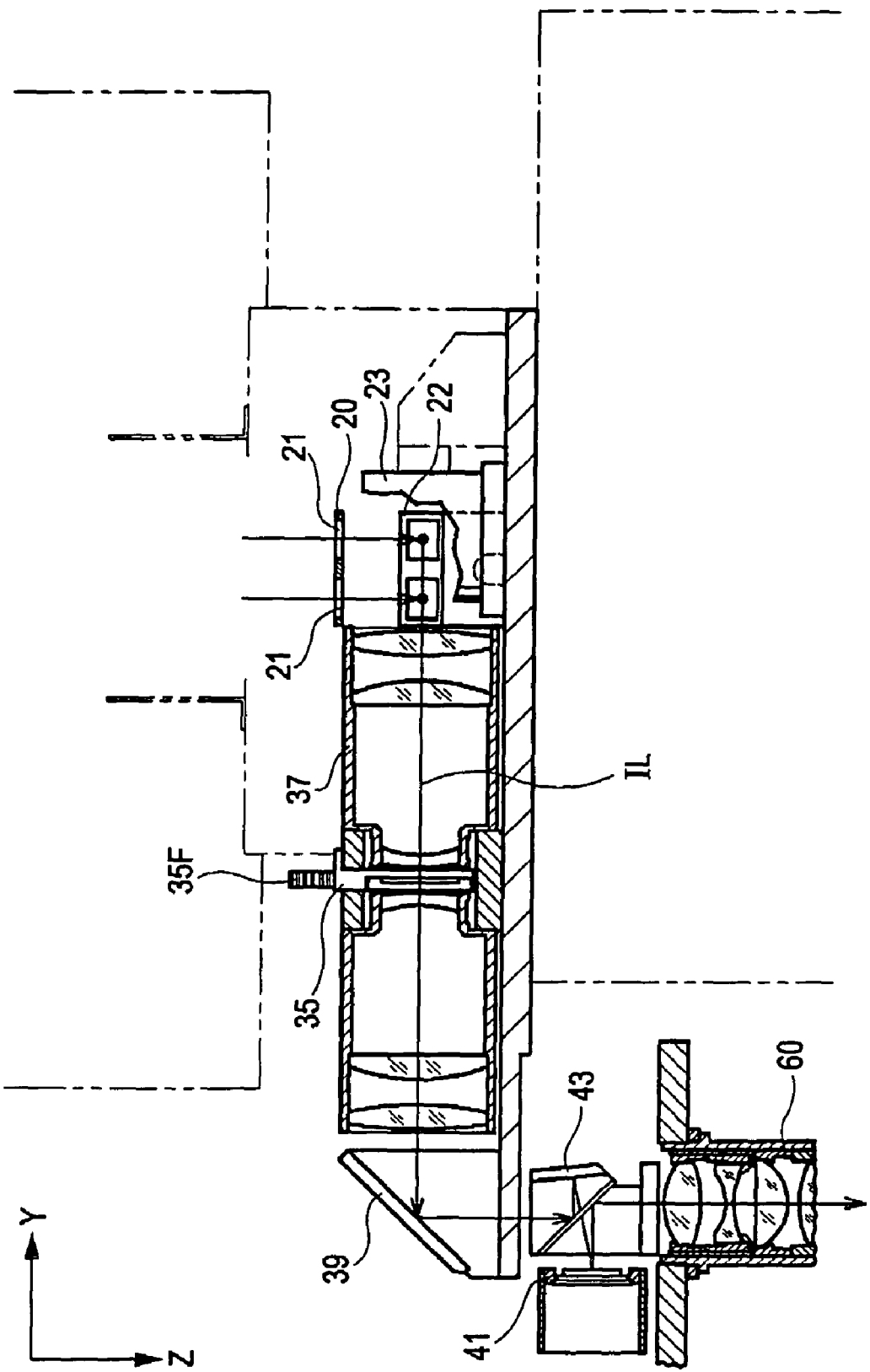
FIG. 5 is a cross-sectional view depicting a second lighting system 37 of the exposure device 10.

FIG. 5 shows a cross section of one of the second lighting systems 37-1 to 37-8. In this drawing, a reference numeral 20 indicates an aperture member that represents any one of the aperture members 20-1 and 20-2. Likewise, a reference numeral 23 indicates a total reflection mirror that represents any one of the total reflection mirrors 23-1 to 23-8. A reference numeral 22 indicates a reflective optical element that represents any one of the reflective optical elements 22-1 to 22-2. A reference numeral 37 indicates a second lighting system that represents any one of the second lighting systems 37-1 to 37-8. A reference numeral 39 indicates a mirror that represents any one of mirrors 39-1 to 39-8 (see FIG. 1). A reference numeral 41 indicates a DMD that represents any one of the DMDs 41-1 to 41-8. A reference numeral 43 indicates a reflection prism that represents any one of reflection prisms 43-1 to 43-8 (see FIG. 1). A reference numeral 60 indicates a projection optical system that represents any one of the projection optical systems 60-1 to 60-8.

The light beam IL passes through the aperture member 20 and is then reflected by the reflective optical element 22 and the total reflection mirror 23 in this order. Following this, the light beam IL reaches the DMD 41 through the second lighting system 37 that is constituted by the iris adjuster 35 and other optical components such as lenses.

The iris adjuster 35 is provided with an iris window, and the inner window area of this window is set such that the intensities of all the light beams IL are nearly equal. The size of this window area may be fixed beforehand, or varied by motors, etc. as necessary.

The iris adjuster 35 receives an approximately quarter of the whole light or heat emitted from the high pressure mercury lamp 10-1 or 10-2. When the iris adjuster 35 slightly closes the iris window to attenuate the light beam IL, the beam impinges on the inner edge of the iris adjuster 35 and heats it. Accordingly, the iris adjuster 35 may have a blade-shaped heatsink 35F for receiving coolant from a cooled nozzle, thereby preventing the excessive temperature rise of the iris adjuster 35 itself. The heatsink 35F may be composed of multiple flat plates.

After passing through the second lighting system 37, the light beam IL is reflected by the mirror 39. Subsequently, the is reflected light beam IL travels in parallel to the Z axis, and reaches the reflection prism 43. The reflection prism 43 allows the light beam IL to be curved and directed toward the DMD 41 and, then reflects the light beam IL returned from the micro mirrors M of the DMD 41 toward the projection optical system 60.

<DMD>

Figure 6A:
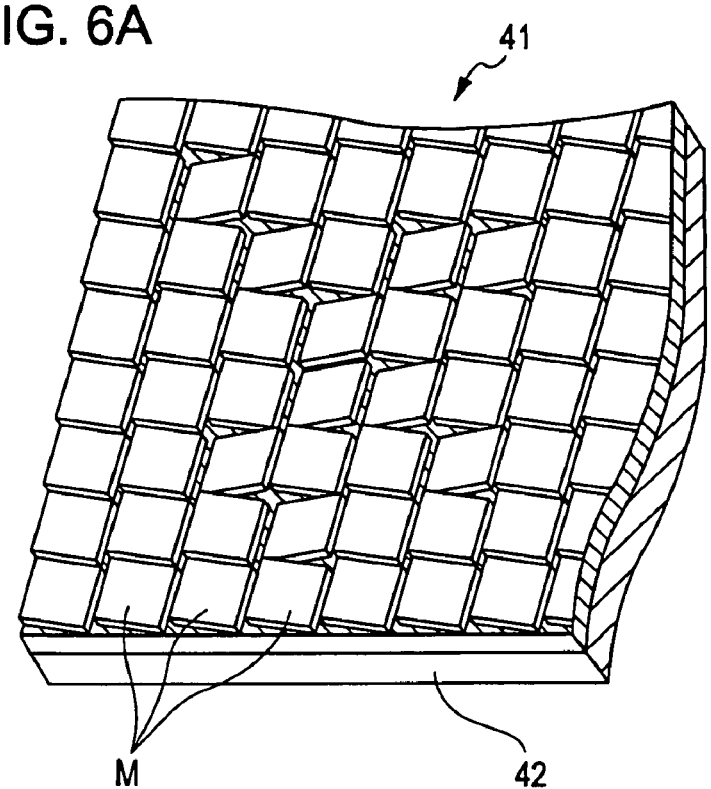
FIG. 6A is a perspective view of the DMD 41.
Figure 6B:
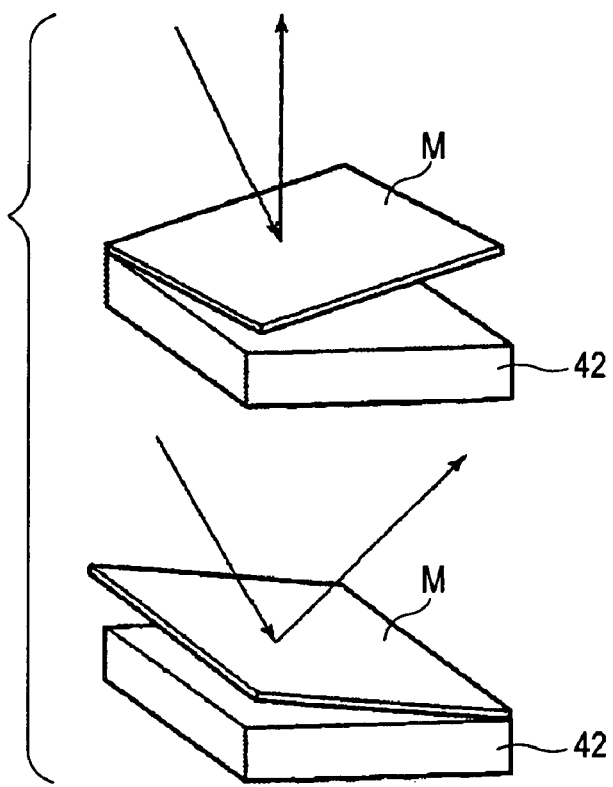
FIG. 6B is a schematic view depicting the movement of the micro mirror M.

FIG. 6A shows the DMD 41, and FIG. 6B shows the function of the micro mirror M. In this embodiment, the exposure device 100 has the eight DMDs, and the reflection surface of each of them is composed of, for example, 1310720 (1024 by 1280) micro mirrors M arranged in a matrix fashion. In the DMD 41, the 1024 micro mirrors M are arrayed on the X side and 1280 micro mirrors M are arrayed on the Y side. Each micro mirror M is about 11.5 square IIm long.

The micro mirror M has a high reflection coefficient and is fabricated by subjecting an aluminum sputtering treatment to a wafer 42. The DMD 41 swivels the micro mirrors M by means of static electricity. As shown in FIG. 6B, the micro mirror M can be swiveled around the diagonal and have two stable orientations. Once the micro mirror M (m, n) ($1 \leq m \leq 1024$, $1 \leq n \leq 1280$) is positioned facing the object CB, the light beam IL reflected by the DMD 41 travels toward the projection optical system 60. Otherwise, once the micro mirror M (m, n) does not face the projection optical system 60, the light beam travels to a light absorber (not shown), that is, propagates away from the projection optical system 60.

<Operation of Exposure Device>

Next, an operation of the exposure device 100 will be described below with reference to FIGS. 7A to 7C and 8.

Figure 7B:
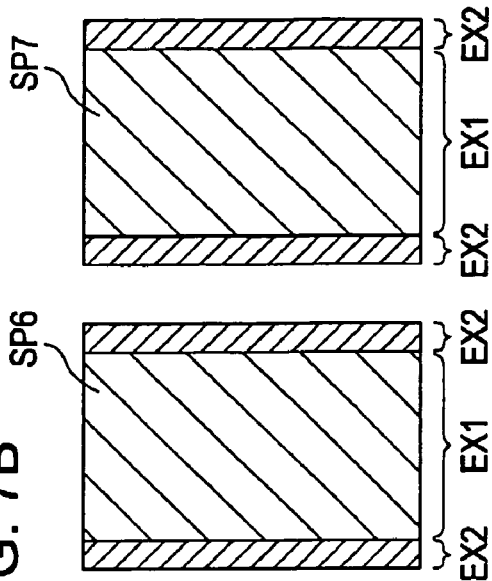
FIG. 7B is a view depicting a stitching operation of the exposure device 100.
Figure 7C:
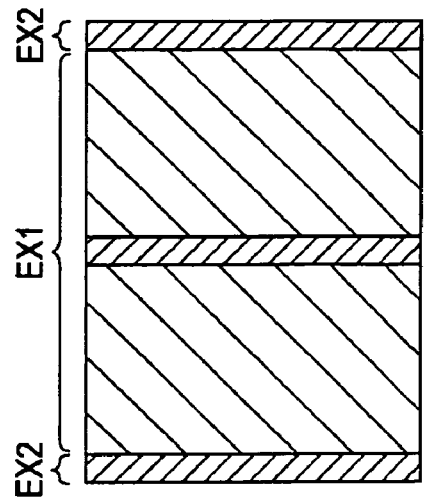
FIG. 7C is another view depicting the stitching operation.
Figure 7A:
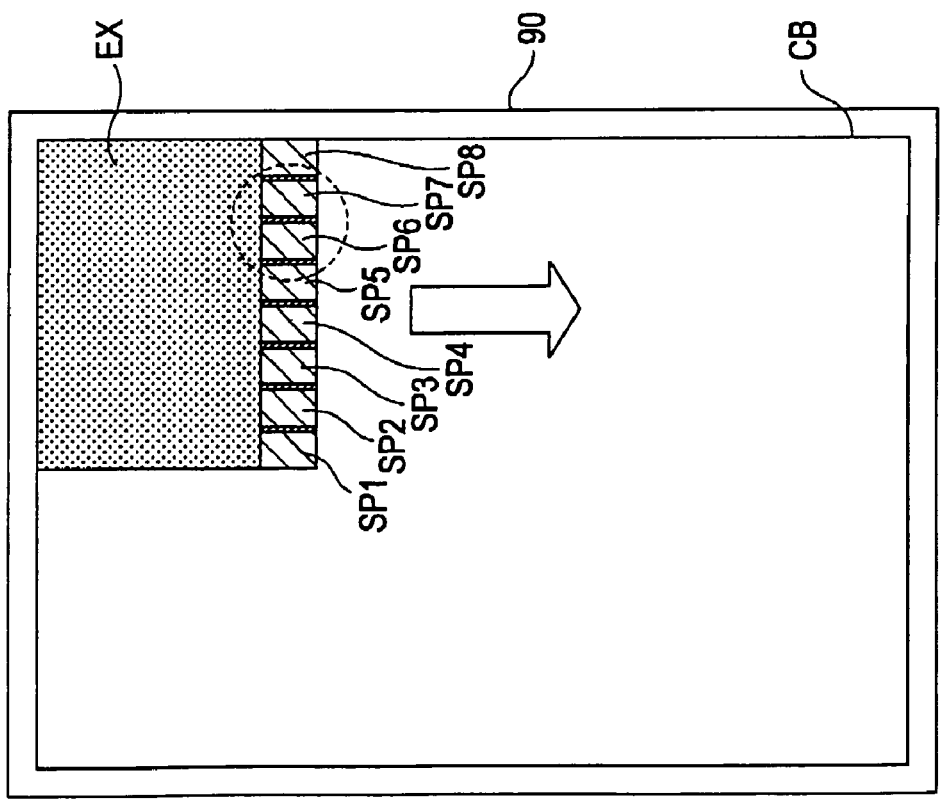
FIG. 7A is a view depicting an exposure process applied to an object CB on an object table 90.
Figure 8:
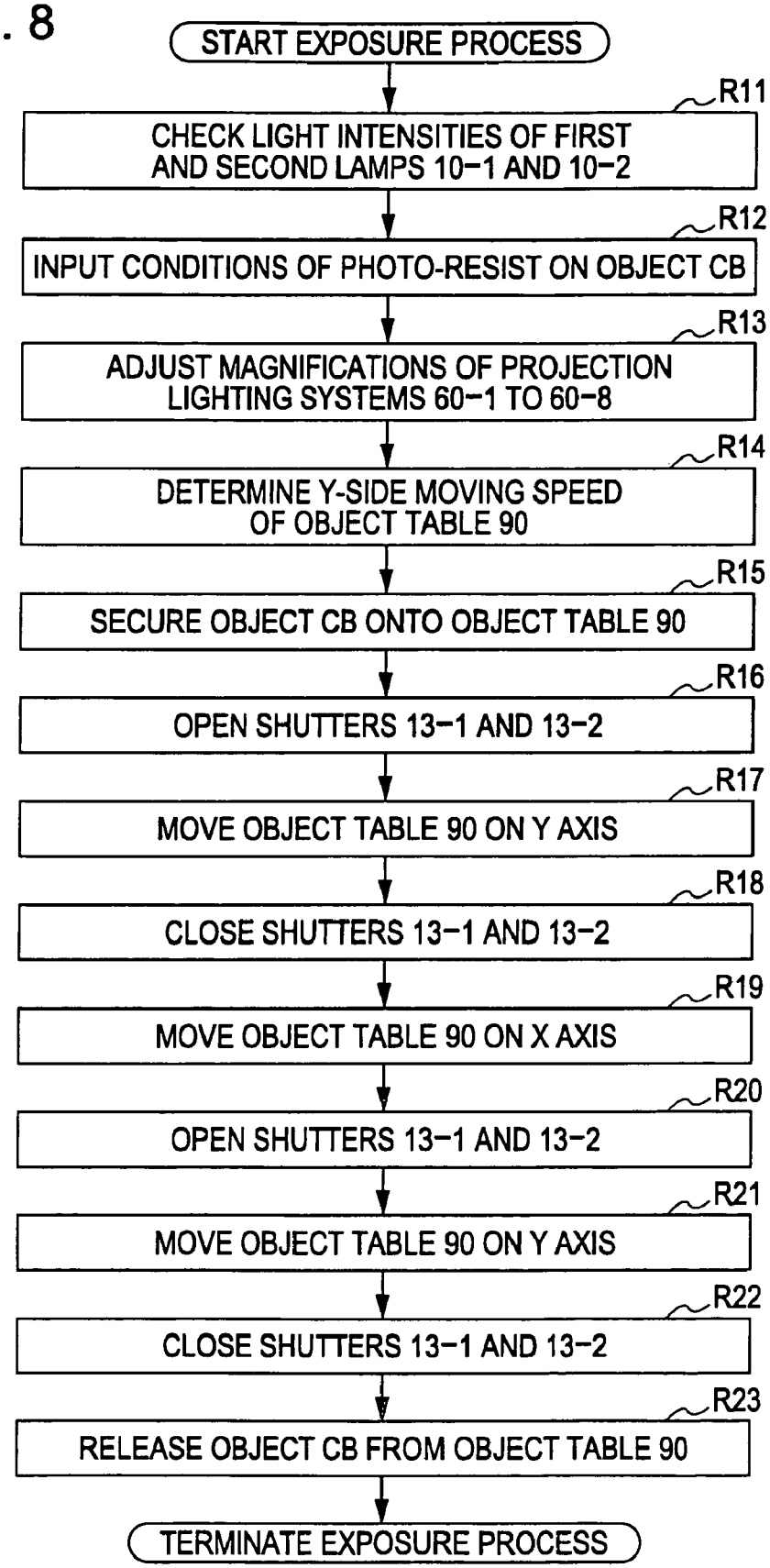
FIG. 8 is a flowchart of the exposure process performed by the exposure device 100.

FIG. 7A depicts the object CB having undergone an exposure process on the object table 90 by the exposure device 100. FIGS. 7B and 7C depict a stitching operation performed by the exposure device 100, and FIG. 8 depicts a flow of the exposure process.

Referring to FIG. 7A, filled rectangular areas SP1 to SP8 represent exposure blocks formed on the X-Y plane (see FIG. 1). In addition, those areas are created by the light beams IL from the projection optical systems 60-1 to 60-8, respectively. Specifically, the exposure blocks SP1 to SP8 arrayed on the X axis are formed by being exposed to the spatially modulated light beams. In addition, while the object table is moving on the Y axis (or in the arrow direction), those exposure blocks, that is, desired patterns are being formed on the whole surface of the object CB. The object CB has a photoresist or a dry film coated on its surface. An exposure region EX consisting of the exposure blocks is extending toward one edge of an object CB as the object table 90 is moving on the Y axis.

Once the exposure blocks SP1 to SP8 reach the edge of the object CB, the shutters 13-1 and 13-2 (see FIG. 2) are closed to block off the light beams IL. Subsequently, the object table 90 moves on the X axis until an unexposed area of the object CB is located directly under the projection optical systems 60-1 to 60-8. Then, after the shutters 13-1 and 13-2 are opened to pass the light beam IL therethrough, new exposure blocks SP1 to SP8 are formed on the non-exposed area of the object CB. As the object table 90 is moving on the Y axis, the exposure region EX is expanding toward the edge of the object CB. In this way, an electric circuit is finally formed on the whole surface of the object CB such as an electronic circuit substrate.

The above process flow will be described below in detail with reference to the flowchart of FIG. 8.

At a step R11, the exposure device 100 checks the light intensities of the first and second high-pressure mercury lamps 10-1 and 10-2 by using the first optical sensors SS11 and SS12, respectively. Based on the checked result, power supply controllers 19-1 and 19-2 (see FIG. 9) adjust both light intensities so as to have substantially the same value. After the adjustment is over, the shutters 13-1 and 13-2 block off the light beams IL.

At a step R12, an operator inputs, to the exposure device 100, the conditions of sensibility of the photoresist or the like coated on the object CB.

At a step R13, the exposure device 100 adjusts the magnifications of the projection optical systems 60-1 to 60-8. The object CB is assumed to be 640 mm long on the X side. The exposure device 100 adjusts the magnifications of the projection optical systems 60-1 to 60-8 such that each exposure block is 40 mm long on the X side. In this case, the total length of the exposure blocks SP1 to SP8 is 320 mm. Thus, if the object table 90 shifts in parallel with the X axis at one time, then the exposure process for the lateral area (640 mm long) of the object CB is finished. Note that this explanation ignores stitching regions (to be described later). In actual cases, the exposure device 100 adjusts the magnifications of the projection optical systems 60-1 to 60-8 such that each exposure block is 40 mm or longer on the X side. Alternatively, the exposure block may be 12 mm or 14 mm long in accordance with the width of the DMD. In this case, the magnification is adjusted to 1:1.

At a step R14, the exposure device 100 determines a speed at which the object table 90 moves in parallel with the Y axis (or in the direction of the arrow of FIG. 7A). Note that this determination is based on the photoresist of the object CB, the light intensities of the first and second high-pressure mercury lamps 10-1 and 10-2 and the magnifications of the projection optical systems 60-1 to 60-8.

At a step R15, the object table 90 absorbs the object CB by means of negative pressure, so that the object CB is fixed.

At a step R16, the exposure device 100 opens the shutters 13-1 and 13-2. As a result, patterns are being created on the object CB.

At a step R17, the exposure device 100 moves the object table 90 in parallel with the Y axis.

At a step R18, once the exposure blocks SP1 to SP8 reach an edge of the object CB, the shutters 13-1 and 13-2 block off the light beams IL. At this time, the exposure region EX occupies the half area of the object CB.

At a step R19, the exposure device 100 moves the object table 90 in parallel with the X axis.

At a step R20, the exposure device 100 opens the shutters 13-1 and 13-2, so that the patterns are being created on the object CB again.

At a step R21, the exposure device 100 moves the object table 90 in parallel with the Y axis (or in the direction opposite to the arrow of FIG. 7A).

At a step R22, once the exposure blocks SP1 to SP8 reach the edge of object CB, the shutters 13-1 and 13-2 block off the light beams IL. Now, the exposure region EX occupies the whole area of the object CB.

At the step R23, the object table 90 stops absorbing the object CB, and the operator or a transfer machine then removes it from the object table 90.

<Stitching Operation>

Next, the stitching operation will be described below.

In general, the borders between the exposure blocks SP seem to be distinguishing because of the misalignment of the blocks and the difference of intensities of the light beams IL. Hence, the stitching operation is taken place in order to decrease those distinguish levels. In FIG. 7B, the exposure blocks SP6 and SP7 of FIG. 7A are shown enlargedly and separately. Referring to this drawing, full exposure blocks EX1 and half exposure blocks EX2 are defined on the exposure blocks SP6 and SP7.

The full exposure block EX1 of the block SP6 is formed on the condition that the micro mirrors M of the DMD 41-6 are oriented to transmit the full amount of the light beam IL to the object CB in accordance with circuit patterns. In contrast, the half exposure blocks EX2 of the block SP6 are formed on the condition that the micro mirrors M of the DMD 41-6 are oriented to transmit the half amount of the light beam IL to the object CB. In order to create the circuit patterns on the half exposure blocks EX2, the exposure process needs to be repeated there twice. As to the full exposure block EX1 and the half exposure blocks EX2 of the block SP7, the micro mirrors M of the DMD 41-7 also operate in the same way as that of the DMD 41-6. Therefore, if the half exposure block EX2 of the exposure block SP6 overlaps with that of the exposure block SP7, then the overlapped blocks turn into the single full exposure block EX1 as shown in FIG. 7C. Note that the half exposure block EX2 of the exposure block SP1 that is formed by a first exposure process is adapted to overlap with that of the exposure block SP8 which is formed by a second exposure process as shown in FIG. 7A.

<Adjustment of Light Intensity>

Figure 9:
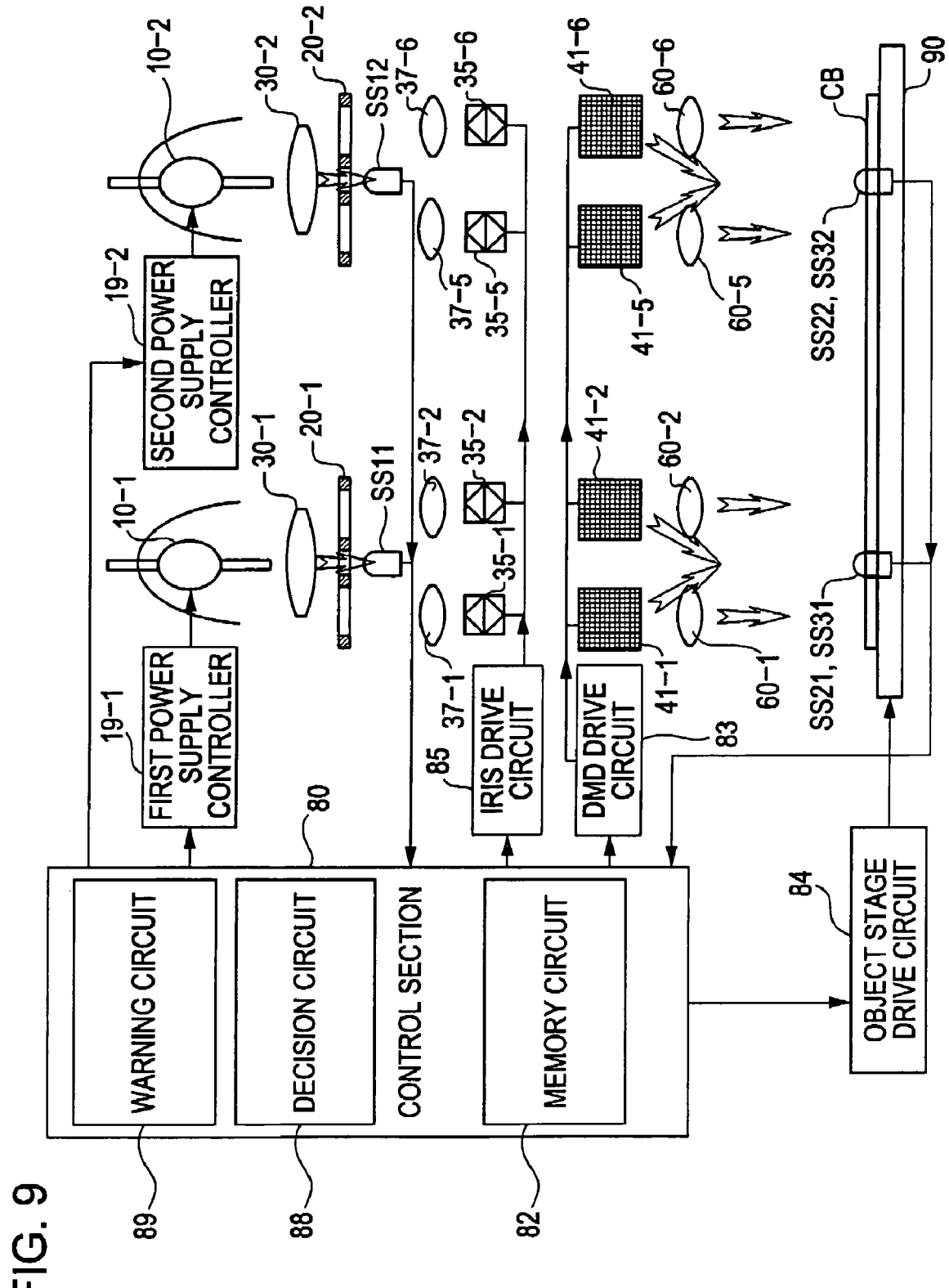
FIG. 9 is a block diagram for adjusting the light beams of the exposure device 100 and diagnosing status of the optical system thereof.

FIG. 9 shows a block diagram of the exposure device 100. With reference to this drawing, a description will be given below, of a process for adjusting the light beams IL and detecting an abnormality of the device itself.

For the simplicity's sake, this block diagram depicts only the four second lighting systems (37-1, 37-2, 37-5 and 37-6), the four iris adjusters (35-1, 35-2, 35-5 and 35-6), the four DMDs (41-1, 41-2, 41-3 and 41-4), and the four projection optical systems (60-1, 60-2, 60-5 and 60-6), although each of them is eight in number.

Figure 10:
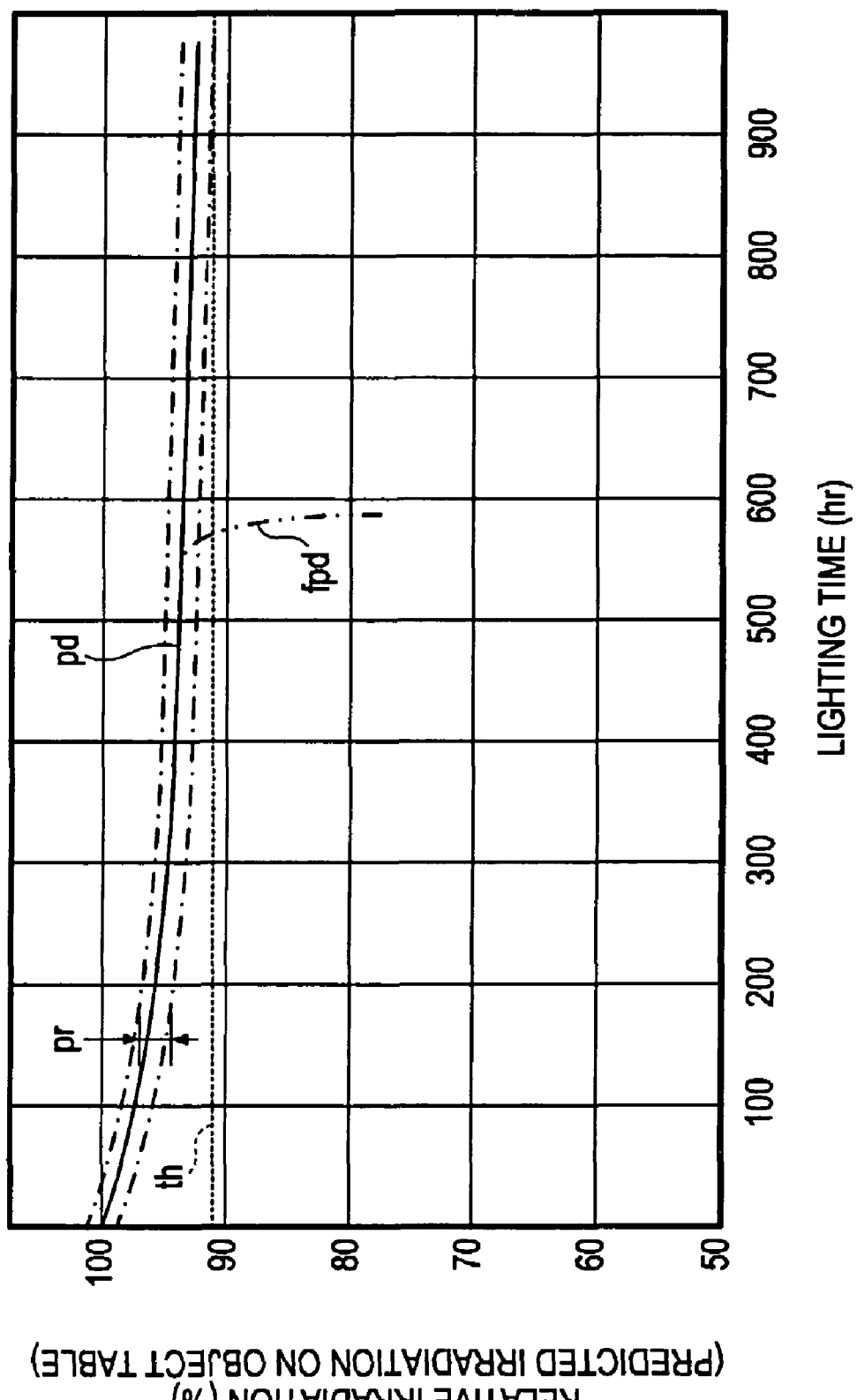
FIG. 10 is a graph showing the irradiation characteristics "pd" on the object table 90 with time.

In this drawing, a control section 80 is connected to a first power supply controller 19-1, a second power supply controller 19-2 and a DMD drive circuit 83. In addition, the control section 80 is also connected to an object stage drive circuit 84 and an iris drive circuit 85. The control section 80 contains a memory circuit 82, a decision circuit 88 and a warning circuit 89. The memory circuit 82 stores irradiation characteristics "pd" on the object table 90, which depend on the aged deterioration of the high pressure mercury lamps 10-1 and 10-2, as shown in FIG. 10. Since the exposure device 100 has the two high pressure mercury lamps (10-1 and 10-2), the memory circuit 82 further stores a light intensity range "pr", within which the light intensities of the first and second high-pressure mercury lamps 10-1 and 10-2 are regulated to lie. The memory circuit 82 stores a threshold "th" that indicates a lower limit of the light intensity. If the light intensity drops below this threshold "th", then the rate at which the exposure device 100 conducts the process is prone to decrease, thus deteriorating the production capacity.

The decision circuit 88 sends instructions to the power supply controllers 19-1 and 19-2, the object stage drive circuit 84, the iris drive circuit 85 and the warning circuit 89, based on the monitoring results of the first, second and third optical sensors.

The warning circuit 89 informs an operator that the abnormality has occurred by making a sound or flashing a lamp, upon detection of any abnormality. If the high pressure mercury lamp or the DMD fails, then the light intensity drops significantly and falls below the threshold "th" shown by a dot-dashed line "fpd" of FIG. 10. In such cases, the decision circuit 88 determines that an abnormality has occurred, based on the monitoring results of the first, second and third optical sensors. Then, the decision circuit 88 allows the warning circuit 89 to output an alarm.

The first and second power supply controllers 19-1 and 19-2 adjust electric power supplied to the first and second high-pressure mercury lamps 10-1 and 10-2, respectively. The DMD drive circuit 83 operates the micro mirrors M arranged in a 1024 by 1280 matrix fashion, based on circuit patterns supplied from the control section 80. The object stage drive circuit 84 moves the object table 90 at a predetermined speed. The iris drive circuit 85 adjusts the iris adjusters 35-1 to 35-8 in such a way that the intensities of the light beams IL are nearly equal.

In this embodiment, the light intensities of the high pressure mercury lamps 10-1 and 10-2 that are detected by the first optical sensors SS11 and SS12 are defined "output reports Γ1-1 and Γ1-2." The light intensities which are detected by the second optical sensors SS21 or SS22 are defined "output reports Γ2-$n$ ($n$=1 to 8)." The light intensities which are detected by the third optical sensor SS31 or SS32 are defined "output reports Γ3-$n$ ($n$=1 to 8)."

<Operating Status of High Pressure Mercury Lamp>

The first optical sensors SS11 and SS12 detect the intensities of the light beams IL from the high pressure mercury lamps 10-1 and 10-2 that have passed through the first lighting systems 30-1 and 30-2, respectively. Based on the output reports Γ-1 and Γ1-2 from the first optical sensors SS11 and SS12, the first and second power supply controllers 19-1 and 19-2 adjust the balance of the intensities of the light beams IL, which are sent from the high pressure mercury lamps 10-1 and 10-2 through the aperture members 20-1 and 20-2, etc. respectively. After the adjustment, the intensities of the light beams outputted from the aperture members 20-1 and 20-2 are nearly equal.

The decision circuit 88 compares the output reports Γ1-1 and Γ1-1 with the sensitivity condition of the object CB that has been inputted beforehand. In addition, it determines whether or not patterns can be formed appropriately, based on the compared results.

The decision circuit 88 can conform the emission efficiencies of the high pressure mercury lamps 10-1 and 10-2 by the comparing the output reports Γ-1 and Γ1-2 with pre-inputted reference intensity of a high pressure mercury lamp. If the light intensities are of proper values, then the control section 80 outputs an operation permission signal. Note that the operation permission signal is used to permit, for example, setting of an exposure or pattern formation through a keyboard or a manual zero offset of the object table 90. Assume that the output report Γ-1 is not of the proper value, even if the maximum electric power is supplied to the first high pressure mercury lamp 10-1. In this case, the warning circuit 89 outputs an alarm for indicating the dead or failure of the first high pressure mercury lamp 10-1 or the abnormality of the power source.

It is noted that the exposure device 100 fails to irradiate the whole surface of the object CB with uniform light, unless the two high pressure mercury lamps 10-1 and 10-2 send out the same intensity light beams IL. Hence, the decision circuit 88 compares the outputs from both lamps, and controls the power sources in such a way that both outputs are nearly equal. This ensures that all the light beams IL have the same intensity.

<Operating Status of DMDs and Projection Optical Systems>

The second optical sensors SS21 and SS22 detect the intensities of the light beams IL that have passed through the aperture members 20-1 and 20-2, the second lighting systems 37-1 to 37-8, the DMDs 41-1 to 41-8 and the projection optical systems 60-1 to 60-8. While the light beams IL are being detected, the patterns are not formed on the object CB. Simultaneously, the 1310720 micro mirrors M of the DMD 41-1 which are arranged in a 1024 by 1280 matrix fashion have the same orientation in order to send the whole beam IL to the object CB. Likely, all the micro mirrors M of the DMDs 41-2 to 41-8 are set to have the same orientation. This enables the second optical sensors SS21 and SS22 to detect the intensities of the eight beams IL on the same level as the surface of the object CB on object stage 90.

The decision circuit 88 monitors the output reports $\Gamma$2-1 to $\Gamma$2-8 from the second optical sensors S21 and S22. Then, it determines whether or not the output reports $\Gamma$2-1 to $\Gamma$2-8 fall within the light intensity range "pr" shown in FIG. 10. The output reports $\Gamma$2-1 to $\Gamma$2-8 should be substantially the same. Provided that the projection optical system 60-1 fails, only the light intensity of the projection optical system 60-1 is below the proper value.

Assume that the first optical sensors SS11 and SS12 that are arranged near the aperture members 20-1 and 20-2, respectively show substantially the same value. Under these circumstances, the decision circuit 88 can confirm the status of the route from the aperture members 20-1 and 20-2 to the object CB through the projection optical systems 60-1 to 60-8, based on the output reports $\Gamma$2-1 to $\Gamma$2-8 from the second optical sensors SS21 and SS22. If the output report $\Gamma$2-1 for the route between the aperture member 2-2 and the projection optical system 60-2 falls outside the range, then the decision circuit 88 determines that a failure has occurred on this route.

Typically, a reflective mirror, lens and prism that constitute the projection optical system have a long lifetime. In contrast, the lifetime of a DMD is short and, thus needs to be exchanged for another at regular intervals. In view of this fact, if there is a failure on the route between the aperture member 20-1 and the projection optical system 60-1, then the warning circuit 89 may output an alarm for informing the dead or failure of the DMD 41-1.

The exposure device 100 has the third optical sensors SS31 and SS32, and these sensors may be replaced by the second optical sensors SS21 and SS22 as described above. By orienting the micro mirrors M of the DMD 41-1 toward the third optical sensor SS31, it can detect the light beam reflected from the DMD 41-1.

Consider the following two cases.

First; the DMD 41-1 totally reflects the light beam IL, and the reflected beam passes through the projection optical system 60-1. Subsequently, the second optical sensor SS21 detects the intensity of the light beam IL outputted from the projection optical system 60-1. After the detection, the second optical sensor SS21 outputs the output report $\Gamma$2-1.

Second, the DMD 41-1 totally reflects the light beam toward the third optical sensor SS31. Following this, the third optical sensor SS31 directly detects its light intensity and, then outputs the output report $\Gamma$3-1.

Next, the output reports $\Gamma$2-1 and $\Gamma$3-1 are compared. As long as the DMD 41-1 and the projection optical system 60-1 do not fail, the output reports $\Gamma$2-1 and $\Gamma$3-1 are substantially the same. This is because the projection optical system 60-1 hardly attenuates light. Otherwise, if both reports are considerably different, then the decision circuit 88 determines that a failure has occurred on the route between the DMD 41-1 and the projection optical system 60-1. In response to this, the warning circuit 89 outputs an alarm for informing this failure.

If the output reports $\Gamma$2-1 to $\Gamma$2-8 from the second optical sensors SS21 and SS22 are nearly equal, then the projection optical systems 60-1 to 60-8 are considered normal. Therefore, if the output report $\Gamma$3-1 is not of the proper value, then the decision circuit 88 determines that the micro mirrors M of the DMD 41 have operated abnormally. Subsequently, the warning circuit 89 outputs an alarm for informing the failure of micro mirrors M of the DMD 41-1.

Figure 11:
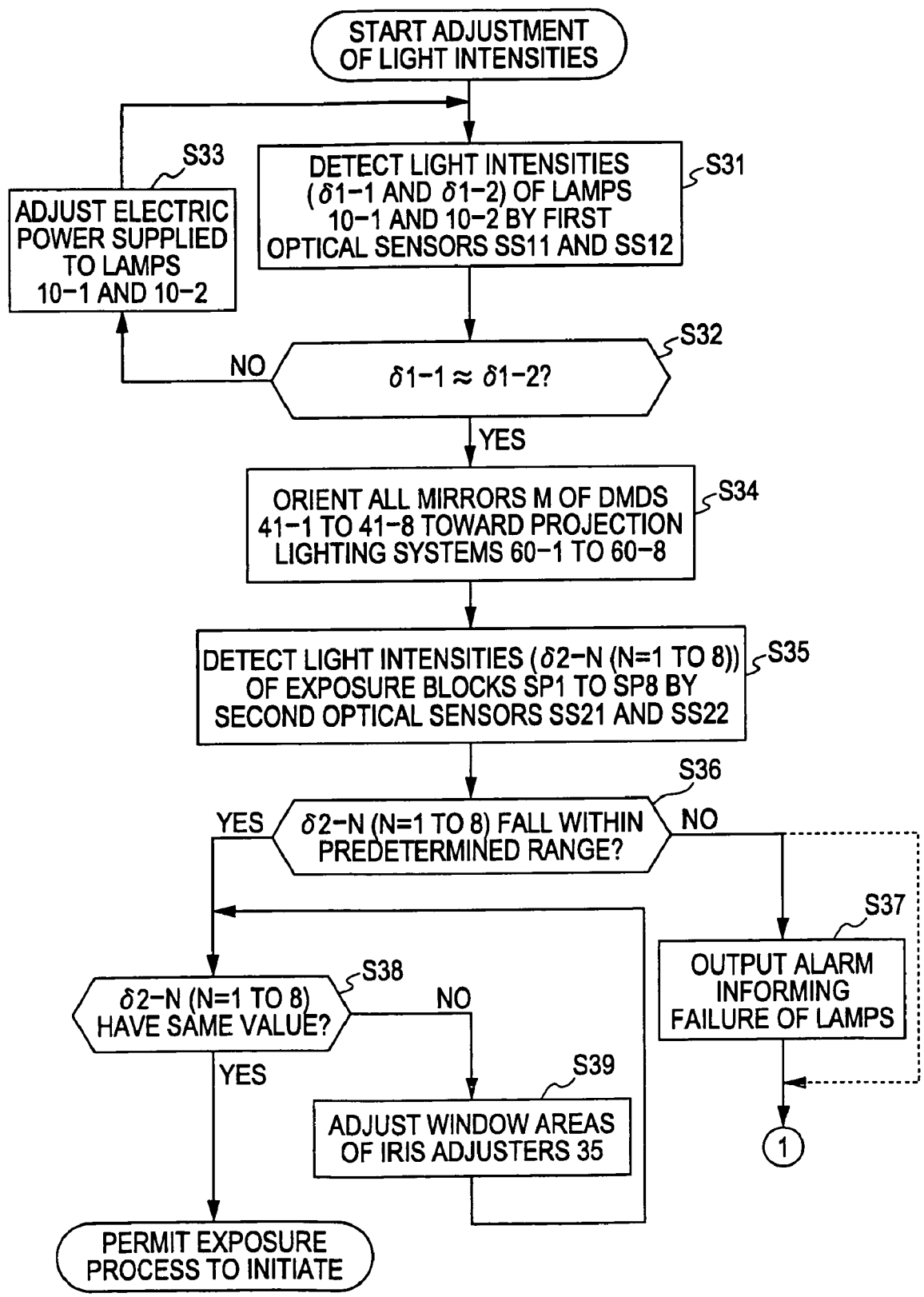
FIG. 11 is a flowchart of monitoring the operating status of the high pressure mercury lamps 10-1 and 10-2, the DMDs 41-1 to 41-8, and the projection optical systems 60-1 to 60-8.

FIGS. 11 and 12 show flows of diagnosing the operating status of the high pressure mercury lamps 10-1 and 10-2, the DMDs 41-1 to 41-8 and the projection optical systems 60-1 and 60-2.

Referring to FIG. 11, at a step S31, the first optical sensors SS11 and SS12 detect the light intensities of the high pressure mercury lamps 10-1 and 10-2, respectively. Following this, the first optical sensors SS11 and SS12 send the output reports $\Gamma$1-1 and $\Gamma$1-2 to the decision circuit 88.

At the step S32, the decision circuit 88 determines whether or not both output reports exceed the threshold "th" and are nearly equal. If the output reports $\Gamma$1-1 and $\Gamma$1-2 are determined to be different ("No" at step S32), then the process proceeds to a step S33.

At the step S33, the first and second power supply controllers 19-1 and 19-2 adjust the electric power supplied to both lamps 10-1 and 10-2, respectively in such a way that both intensities are nearly equal. Following this, the process returns to the steps S31 and S32 in this order.

If the output reports $\Gamma$1-1 and $\Gamma$1-2 are determined to be nearly equal ("Yes" at step S32), then the process proceeds to a step S34.

At the step S34, all the mirrors M of the DMDs 41-1 to 41-8 are oriented to face the projection optical systems 60-1 to 60-8, respectively.

At a step S35, the second optical sensors SS21 and SS22 detect the intensities of the light beams IL from the projection optical systems 60-1 to 60-8, respectively on substantially the same surface as the object CB. After the detection, both sensors SS21 and SS22 send output reports $\Gamma$2-$n$ ($n$=1 to 8) to the decision circuit 88.

At a step S36, the decision circuit 88 determines whether or not all the output reports $\Gamma$2-$n$ fall within the light intensity range "pr" (see FIG. 10). If all the output reports $\Gamma$2-$n$ do not fall within the range "pr" ("No" at step S36), then the process proceeds to a step S37 or goes to a step S41 of FIG. 12 by following a dot arrow. Otherwise, ("Yes" at step S36), the process proceeds to a step S38.

At the step S37, the warning circuit 89 outputs an alarm informing that all the intensities of the exposure blocks SP1 to SP8 are not within the range "pr." At this time, because the first optical sensors SS11 and SS12 have not read any abnormal value, the abnormality seems to occur on the routes between the aperture members 20-1 and 20-2 and the projection optical systems 60-1 to 60-8.

Alternatively, the warning circuit 89 may output the alarm after the abnormality is pinpointed. In this case, the process skips the step 37 and proceeds to a step S41 of FIG. 12 by following the dot arrow.

Typically, a projection optical system has a long lifetime, while a DMD needs to be exchanged for another at regular intervals. In consideration of this fact, if an abnormality has been found on the routes between the aperture members 20-1 and 20-2 and the projection optical systems 60-1 to 60-8, then the warning circuit 89 outputs an alarm indicating that the DMDs 41-1 to 41-8 have failed or been dead.

At the step S38, the decision circuit 88 determines whether or not all the output reports $\Gamma 2\text{-}n$ are nearly equal. In fact, the light beams IL on the exposure blocks SP1 to SP8 must have substantially the same intensity on the surface of the object CB. If they are nearly equal ("Yes" at step S38), the exposure device 100 determines that the exposure process can be started. Otherwise, although the output reports $\Gamma 2\text{-}n$ (n=1 to 8) fall within the range "pr," if they are considerably different ("No" at step S38), then the process proceeds to a step S39.

At the step S39, the iris adjusters 35 shown in FIG. 5 adjust the light intensities of the exposure blocks SP1 to SP8.

Referring to FIG. 12, at the step S41, the DMD drive circuit 83 drives the micro mirrors M in response to instructions from the control section 80. Specifically, all the mirrors M of each of the DMDs 41-1 to 41-8 are oriented to face the outside of the projection optical systems 60-1 to 60-2. This operation aims to directly detect the intensities of the light beams IL reflected by the DMDs 41-1 to 41-8 by the third optical sensors SS31 and SS32.

At the step S42, the third optical sensors SS31 and SS32 detect the intensities of the light beams IL reflected by the DMDs 41-1 to 41-8. Then, they send the output reports $\Gamma 3\text{-}n$ (n=1 to 8) to the decision circuit 88.

At the step S43, the decision circuit 88 determines whether or not the output reports $\Gamma 2\text{-}n$ and $\Gamma 3\text{-}n$ from the second and third optical sensors are different, respectively. If they are different ("Yes" at step S43), then the process proceeds to a step S44. Otherwise ("No" at step S43), it goes to a step S45.

At the step S44, the warning circuit 89 outputs an alarm informing that the DMDs 41-1 to 41-8 and/or the projection optical systems 60-1 to 60-8 have failed. In this case, all the output reports $\Gamma 2\text{-}n$ do not fall within the range "pr," and the output reports $\Gamma 2\text{-}n$ and $\Gamma 3\text{-}n$ are different, respectively. It can be noted that the output reports $\Gamma 2\text{-}n$ indicate the intensities of the light beams IL sent from the projection optical system 60-1 to 60-8 through the DMDs 41-1 to 41-8, respectively. Meanwhile, the output reports $\Gamma 3\text{-}n$ indicate the intensities of the light beams IL that has been reflected by the DMDs 41-1 to 41-8, respectively. Thus, the decision circuit 88 can conclude that the DMDs 41-1 to 41-8 and/or the projection optical systems 60-1 to 60-8 have failed. As described above, since a projection optical system hardly fails, the decision circuit 88 may determine that the DMDs 41-1 to 41-8 have failed or been dead.

At the step S45, the warning circuit 89 outputs an alarm indicating that a failure has occurred on at least one of the routes between the aperture members 20-1 and 20-2 and the DMDs 41-1 to 41-8. In this case, all the output reports $\Gamma 2\text{-}n$ do not fall within the range "pr," as well as the output reports $\Gamma 2\text{-}n$ and $\Gamma 3\text{-}n$ are nearly equal, respectively. Accordingly, the decision circuit 88 can conclude that an abnormality has occurred on at least one of the routes upstream from the DMDs 41-1 to 41-8. Moreover, because the first optical sensor SS11 and SS12 do not reveal any abnormality (at the step S32), an abnormality is considered to happen at least one of the routes downstream from the aperture members 20-1 and 20-2.

In the above-described embodiment, the exposure device 100 employs the structure in which the projection optical systems 60-1 to 60-8 are fixed and the object table 90 can be moved. However, the present invention is not limited to this structure. Alternatively, the exposure device 100 employs a structure in which the projection optical systems 60-1 to 60-8 can be moved and the object table 90 is fixed.

Furthermore, the exposure device 100 is equipped with the two high pressure mercury lamps. However, the number of the high pressure mercury lamps may be any positive integer.

Moreover, each of the aperture members 20-1 and 20-2 splits the single light beam into the four. However, the number of the split beams is not limited to four. Alternatively, it may be any positive integer other than one.

From the aforementioned explanation, those skilled in the art ascertain the essential characteristics of the present invention and can make the various modifications and variations to the present invention to adapt it to various usages and conditions without departing from the spirit and scope of the claims.

What is claimed is:

1. An exposure device for forming predetermined patterns onto an object by means of UV light emitted from at least one optical source, said exposure device comprising:
   an object stage on which the object is to be set;
   at least one aperture member having a first open window and a second open window for splitting a light beam from the optical source into a first light beam and a second light beam;
   first and second spatial light modulators for spatially modulating the first and second light beams, respectively;
   first and second projection optical systems for irradiating the object with the first and second light beams that have been spatially modulated by the first and second spatial light modulators, respectively;
   at least one first optical sensor for detecting an intensity of the light beam from the optical source, and for outputting a first output report indicating the detected intensity, the first optical sensor being located near the aperture member;
   one or more second optical sensors for detecting intensities of the first and second light beams that have passed through the first and second projection optical systems, respectively, and for outputting second output reports indicating the detected intensities; and
   a decision section for diagnosing status of a route between the aperture member and the object, based on the first and second output reports.

2. The exposure device according to claim 1, wherein the second optical sensors are located on the object stage, and move into and escape from paths of the first and second light beams that have passed through the first and second projection optical systems, respectively.

3. The exposure device according to claim 2, further comprising
   a first iris adjuster for varying the intensity of the first light beam, the first iris adjuster being located on a path of the first light beam between the aperture member and the object; and
   a second iris adjuster for varying the intensity of the first light beam, the second iris adjuster being located on a path of the second light beam between the aperture member and the object, wherein the decision section controls operations of the first and second iris adjusters, based on the second output reports on the first and second light beams.

4. The exposure device according to claim 2, further comprising:
a memory section for storing data on ideal intensity of light irradiated to the object, the data taking aged deterioration of the ideal intensity into account; and
a warning section for outputting an alarm, if at least one of the second output reports is different from the ideal data stored in the memory section by more than an allowable amount.

5. The exposure device according to claim 2, further comprising a warning section for outputting an alarm indicating the status of the route between the aperture member and the object, if at least one of the first and second output reports falls outside a predetermined range.

6. The exposure device according to claim 2,
wherein the decision section comprises a warning section for outputting an alarm indicating status of the first and second spatial light modulators, based on the second output reports on the first and second light beams.

7. The exposure device according to claim 1, further comprising:
a first iris adjuster for varying the intensity of the first light beam, the first iris adjuster being located on a path of the first light beam between the aperture member and the object; and
a second iris adjuster for varying the intensity of the second light beam, the second iris adjuster being located on a path of the second light beam between the aperture member and the object,
wherein the decision section controls operations of the first and second iris adjusters, based on the second output reports on the first and second light beams.

8. The exposure device according to claim 1, further comprising:
a memory section for storing data on ideal intensity of light irradiated to the object, the data taking aged deterioration of the ideal intensity into account; and
a warning section for outputting an alarm, if at least one of the second output reports is different from the ideal data stored in the memory section by more than an allowable amount.

9. The exposure device according to claim 1, further comprising a warning section for outputting an alarm indicating the status of the route between the aperture member and the object, if at least one of the first and second output reports falls outside a predetermined range.

10. The exposure device according to claim 1,
wherein the decision section comprises a warning section for outputting an alarm indicating status of the first and second spatial light modulators, based on the second output reports on the first and second light beams.

11. The exposure device according to claim 1, further comprising one or more third optical sensors for detecting directly intensities of the first and second light beams from the first and second spatial light modulators, respectively and for outputting third output reports indicating the detected intensities,
wherein the decision section diagnoses status of a route between the first spatial light modulator and the object and a route between the second spatial light modulator and the object, based on the second and third output reports.

12. The exposure device according to claim 11,
wherein the second optical sensors comprise the third optical sensors.

13. The exposure device according to claim 11, further comprising a warning section for outputting an alarm indicating a route between the first spatial light modulator and first projection optical system or a route between the second spatial light modulator and second projection optical system, if the second output reports on the first and second light beams do not fall within a predetermined range and are not the same as the third output reports thereon, respectively.

14. The exposure device according to claim 13,
wherein the warning section outputs an alarm about the first or second spatial light modulator.

15. The exposure device according to claim 11, further comprising a warning section for outputting an alarm indicating status of a route between the aperture member and the first spatial light modulator and a route between the aperture member and the second spatial light modulator, if the second output reports on the first and second light beams do not fall within a predetermined range and are the same as the third output reports thereof, respectively.

* * * * *